(12) United States Patent
Krishnan et al.

(10) Patent No.: US 11,094,598 B2
(45) Date of Patent: Aug. 17, 2021

(54) MULTIPLE THRESHOLD VOLTAGE DEVICES

(71) Applicant: GLOBALFOUNDRIES U.S. INC., Santa Clara, CA (US)

(72) Inventors: Bharat V. Krishnan, Mechanicville, NY (US); Rinus Tek Po Lee, Ballston Spa, NY (US); Jiehui Shu, Clifton Park, NY (US); Hyung Yoon Choi, Clifton Park, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/508,815

(22) Filed: Jul. 11, 2019

(65) Prior Publication Data

US 2021/0013109 A1    Jan. 14, 2021

(51) Int. Cl.
| | |
|---|---|
| *H01L 21/8238* | (2006.01) |
| *H01L 21/28* | (2006.01) |
| *H01L 21/8234* | (2006.01) |
| *H01L 21/67* | (2006.01) |
| *H01L 29/49* | (2006.01) |

(52) U.S. Cl.
CPC ........ *H01L 21/823842* (2013.01); *H01L 21/28088* (2013.01); *H01L 21/67063* (2013.01); *H01L 21/82345* (2013.01); *H01L 21/823857* (2013.01); *H01L 29/4966* (2013.01); *H01L 29/4983* (2013.01)

(58) Field of Classification Search
None
See application file for complete search history.

(56) References Cited

U.S. PATENT DOCUMENTS

| | | | |
|---|---|---|---|
| 8,772,149 B2 | 7/2014 | Cartier et al. | |
| 9,012,319 B1 | 4/2015 | Choi et al. | |
| 9,478,538 B1 | 10/2016 | Kim et al. | |
| 9,576,952 B2* | 2/2017 | Joshi | H01L 27/0924 |
| 9,735,024 B2 | 8/2017 | Zaitsu | |
| 2001/0041250 A1* | 11/2001 | Werkhoven | C30B 25/14 428/212 |
| 2007/0052036 A1* | 3/2007 | Luan | H01L 21/823842 257/369 |
| 2013/0087856 A1 | 4/2013 | Ortolland et al. | |
| 2017/0053810 A1 | 2/2017 | Yang et al. | |
| 2017/0076995 A1* | 3/2017 | Chang | H01L 21/823842 |

OTHER PUBLICATIONS

Lee et al., "Thermal Atomic Layer Etching of Titanium Nitride Using Sequential, Self-Limiting Reactions: Oxidation to TiO2 and Fluorination to Volatile TiF4", ACS Publications, 2016, 9 pages.

(Continued)

*Primary Examiner* — Hsien Ming Lee
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to multiple threshold voltage devices and methods of manufacture. The structure includes: a gate dielectric material; a gate material on the gate dielectric material, the gate material comprising different thickness in different regions each of which are structured for devices having a different Vt; and a workfunction material on the gate material.

19 Claims, 2 Drawing Sheets

(56) References Cited

OTHER PUBLICATIONS

Marchack et al., "Methods to Enable Plasma Etching of Transition Metals with Atomic Scale Precision", NCCAVS Plasma Applications Group Workshop on Atomic Layer Etching, Aug. 20, 2018, 46 pages.

Marchack et al., "Cyclic Cl2/H2 quasi-atomic layer etching approach for TiN and TaN patterning using organic masks", Journal of Vacuum Science & Technology A, vol. 35, Issue 5, Jul. 2017, Abstract, 3 pages.

\* cited by examiner

MULTIPLE THRESHOLD VOLTAGE DEVICES

FIELD OF THE INVENTION

The present disclosure relates to semiconductor structures and, more particularly, to multiple threshold voltage devices and methods of manufacture.

BACKGROUND

In modern integrated circuits, e.g., microprocessors, storage devices, etc., a large number of circuit elements, e.g., transistors, are provided on a restricted chip area. The transistors are typically either NMOS (NFET) or PMOS (PFET) type devices. CMOS (Complementary Metal Oxide Semiconductor) technologies are manufactured using both NMOS and PMOS transistor devices. Irrespective of the physical configuration of the transistor device, there are different performance requirements for different functional blocks or regions of the device. Accordingly, it is useful to provide transistors with different threshold voltages to adapt to the different performance requirements.

Generally, threshold voltages may be provided by use of different workfunction materials or different thicknesses of the workfunction materials, etc. However, providing different workfunction materials or different thicknesses of the workfunction materials in the different regions significantly complicates the process flow. For example, to provide different thicknesses of the workfunction materials requires multiple etching and deposition processes of the workfunction materials, each having their own shortcomings.

By way of illustration, etching of the workfunction materials can result in skimming or damage of the underlying high-k gate dielectric material. The damage to the underlying high-k gate dielectric material can lead to reliability issues. To reduce this damage, it is necessary to have a highly selective removal of the workfunction materials. In further attempts to reduce damage to the underlying high-k gate dielectric material, it is possible to use an etch stop material, e.g., TaN, between the underlying high-k gate dielectric material and the workfunction materials. But this additional layer takes up space in the limited gate stack real estate, especially in advanced nodes. Also, using multiple deposition passes of workfunction materials, e.g., TiN, leads to air breaks which result in excessive oxidation of TiN for Voltage threshold (hereinafter referred to as "Vt") shift. It is also known to be very difficult to control the q-time between the deposition processes to avoid such excessive oxidation.

SUMMARY

In an aspect of the disclosure, a structure comprises: a gate dielectric material; a gate material on the gate dielectric material, the gate material comprising different thickness in different regions each of which are structured for devices having a different Vt; and a workfunction material on the gate material.

In an aspect of the disclosure, a structure comprising: a gate dielectric material; a gate material on the gate dielectric material, the gate material comprising an original thickness in a first region and different thicknesses in other regions each of which are structured for devices having a different Vt; and a workfunction material on the gate material of the original thickness and the different thickness, and on the gate dielectric material which is devoid of the gate material.

In an aspect of the disclosure, a method comprises: in a single deposition process, forming a first workfunction material on a gate dielectric material having a first thickness; iteratively etching one or more regions of the first workfunction material by an atomic layer etching process to remove monolayers of the first workfunction material in the one or more different regions, resulting in the first workfunction material having different thicknesses than the first thickness; and forming a second workfunction material on the first workfunction material of different thicknesses.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to multiple threshold voltage devices and methods of manufacture. More specifically, the present disclosure is directed to a method to form multiple threshold voltage devices on a wafer by using atomic layer removal techniques and a resultant structure. Advantageously, the present disclosure provides improved multi-Vt integration schemes using a subtractive patterning approach (vs. an additive patterning approach).

More specifically, the processes described herein provide the advantage of, in embodiments, reducing the amount of times the high-k dielectric material is touched (e.g., exposed to a patterning step) during patterning, which provides benefits in device reliability. In addition, the processes described herein use a single deposition pass of gate material (e.g., p-type workfunction material such as TiN), which increases capacity and provides cost improvements. Moreover, the processes described herein do not require any air-break in the process flow and, as such, there is no concerns for q-time/TiN oxidation. Lastly, the processes described herein do not remove any TiN which is selective to the high-k dielectric material, hence, providing a simpler approach compared to conventional processes.

The multiple threshold voltage devices of the present disclosure can be manufactured in a number of ways using a number of different tools. In general, though, the methodologies and tools are used to form structures with dimensions in the micrometer and nanometer scale. The methodologies, i.e., technologies, employed to manufacture the multiple threshold voltage devices of the present disclosure have been adopted from integrated circuit (IC) technology. For example, the structures are built on wafers and are realized in films of material patterned by photolithographic processes on the top of a wafer. In particular, the fabrication of the multiple threshold voltage devices uses three basic building blocks: (i) deposition of thin films of material on a substrate, (ii) applying a patterned mask on top of the films by photolithographic imaging, and (iii) etching the films selectively to the mask.

Figure 1:
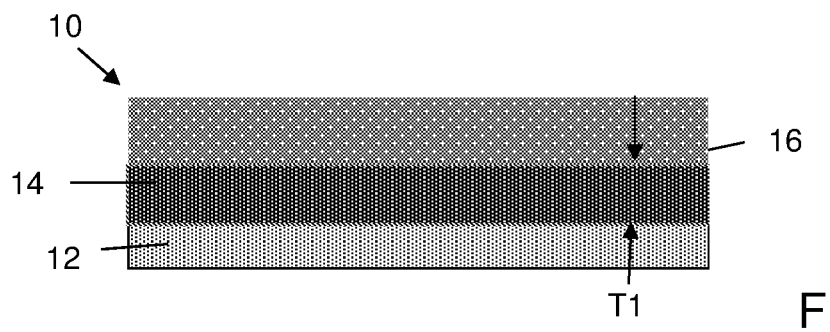
FIG. 1 shows a dielectric material and gate material, amongst other features, and respective fabrication processes in accordance with aspects of the present disclosure.

FIG. 1 shows a dielectric material and gate material, amongst other features, and respective fabrication processes in accordance with aspects of the present disclosure. More specifically, the structure 10 of FIG. 1 shows a gate material 14 deposited on a gate dielectric material 12. In embodiments, the gate material 14 is a metal gate material and, more specifically, a p-type workfunction material for a transistor. Examples of the workfunction materials for a p-channel transistor include Ti, TiAlC, Al, TiAl, TaN, TaAlC, TiN, TiC and Co or combinations thereof. The gate dielectric material 12 can be a high-k gate dielectric material, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The gate dielectric material 12 can be formed on an interlevel dielectric material or other substrate.

In embodiments, the gate material 14 (e.g., TiN) can be deposited by any conventional deposition method including, for example, chemical vapor deposition (CVD), physical vapor deposition (PVD) including sputtering, atomic layer deposition (ALD) or other suitable method. The thickness T1 of the gate material 14 is targeted to a device with a lowest Vt. For example, the thickness T1 can be targeted to the lowest Vt PFET device, e.g., in the range of about 5 Å to 35 Å; although other ranges are contemplated herein depending on the desired characteristics and device performance requirements.

Still referring to FIG. 1, a lithographic stack 16 is formed over the gate material 14. In embodiments, the lithographic stack 16 can be a hardmask or softmask stack of materials. For example, the lithographic stack 16 can be an oxide, nitride or metal oxides. In preferred embodiments, the lithographic stack 16 can be any material or combination of materials compatible with atomic layer etching (ALE) processes.

Figure 2:
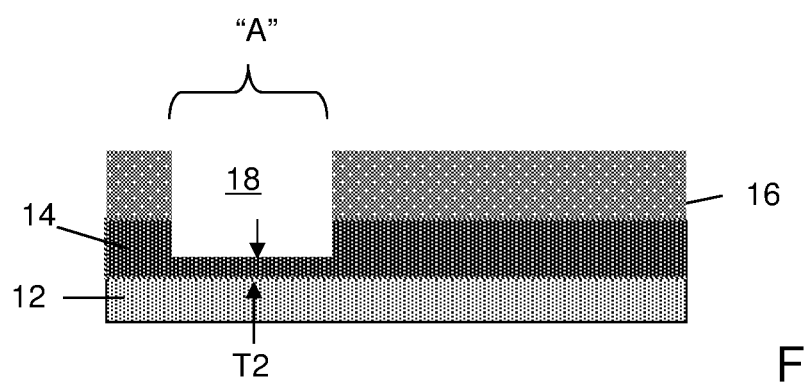
FIG. 2 shows partial removal of the gate material for a first device, amongst other features, and respective fabrication processes in accordance with aspects of the present disclosure.

FIG. 2 shows partial removal of the gate material 14 for a first device and respective fabrication processes. More specifically, an opening 18 is formed in the lithographic stack 16 to expose the underlying gate material 14 in a first region "A". The opening 18 can be formed by any conventional lithography removal step, e.g., by exposing the lithographic stack 18 to energy (light) to form the opening 18 (e.g., pattern). Following the formation of the opening 18, a portion of the underlying gate material 14 in region "A" can be thinned using an ALE process, leaving a thickness T2 of gate material 14 for a first device, e.g., NFET device. In embodiments, the thickness T2 is different than the thickness of T1, e.g., T2<T1, which is targeted to a different Vt device.

It should also be understood by those of skill in the art that ALE is a very well controlled etching process, e.g., better-controlled process than reactive ion etching, allowing for monolayer removal of materials. More specifically, ALE allows for control of critical dimensions to the Å level, especially on ultra-sensitive materials. In one non-limiting example, ALE is provided by a sequence alternating between self-limiting chemical modification steps which affect only the top atomic layers of the gate material 14 and etching steps which remove only the chemically-modified areas, hence allowing the removal of individual atomic layers. For example, a top monolayer can be passivated by chemical precursors to make the top layer more easily etched comparted to sub-layers. The passivated layer is exposed to an ion bombardment with energy below the sputtering threshold. The etch process will stop once the topmost layer of the passivated material is removed, e.g., self-limiting. In this etching process, the underlying gate dielectric material 12 is not exposed or touched.

Figure 3:
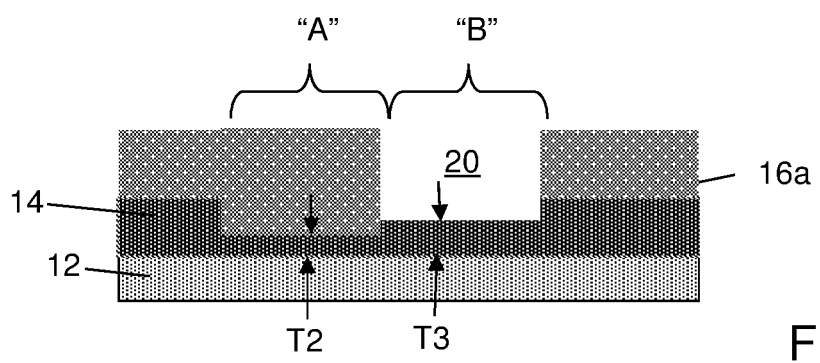
FIG. 3 shows partial removal of the gate material for a second device, amongst other features, and respective fabrication processes in accordance with aspects of the present disclosure.

FIG. 3 shows partial removal of the gate material 14 for a second device, amongst other features, and respective fabrication processes. In these process steps, the original lithographic stack is removed and another lithographic stack 16a is formed over the gate material 14. In embodiments, the lithographic stack 16a can be a hardmask or softmask stack of materials as already described herein. An opening 20 is formed in the lithographic stack 16a to expose the underlying gate material 14 in a second region "B".

Following the formation of the opening 20 by any conventional lithography removal step as already described herein, a portion of the underlying gate material 14 in region "B" can be thinned using an ALE process. The ALE process leaves a thickness of T3 of gate material 14 for another type of device, e.g., PFET device. In embodiments, the thickness T3 can be different than the thickness of T1 and T2, which is targeted to a different Vt device based on the desired performance requirements of the subsequently formed transistor device. In exemplary embodiments, T3<T2<T1, resulting in a stepped configuration of the underlying gate material 14 in regions "A", "B", and "D", without exposing or touching of the gate dielectric material 12.

Figure 4:
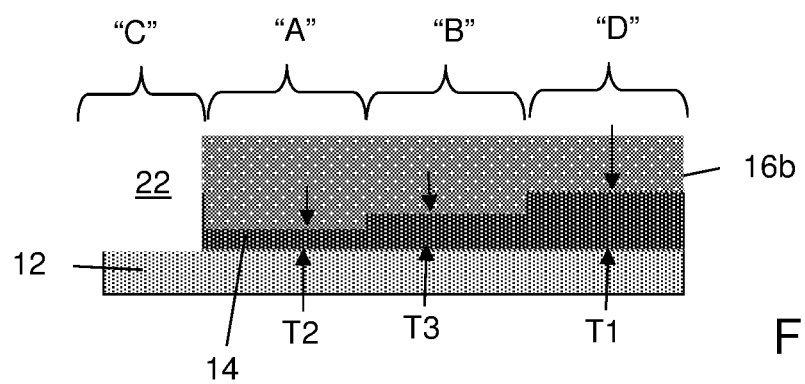
FIG. 4 shows complete removal of the gate material for a third device, amongst other features, and respective fabrication processes in accordance with aspects of the present disclosure.

FIG. 4 shows complete removal of the gate material 14 for a third device in region "C". In these process steps, the lithographic stack 16a is removed and another lithographic stack 16b is formed over the gate material 14. As noted previously, the lithographic stack 16b can be a hardmask or softmask stack of materials, with an opening 22 exposing the underlying gate material 14 in a third region "C". Following the formation of the opening 22 as already described herein, the underlying gate material 14 in region "C" can be completely removed using an ALE process for a device with a highest Vt. In this etching process, the underlying gate dielectric material 12 is finally exposed.

Figure 5:
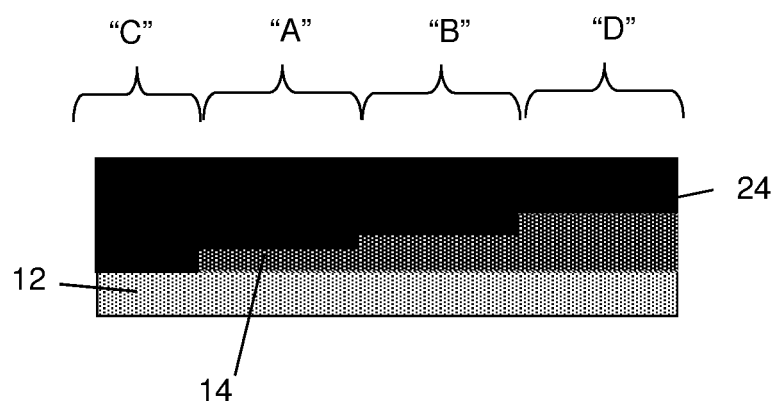
FIG. 5 shows workfunction material on the gate material for separate devices having different Vt, amongst other features, and respective fabrication processes in accordance with aspects of the present disclosure.

FIG. 5 shows the deposition of workfunction material 24 on the gate material 14 and the gate dielectric material 12. More specifically, in these process steps, the lithographic stack 16b is removed and a stack of n-type gate metals 24 is formed on the gate dielectric material 12 and the stepped configuration (e.g., different thicknesses) of the gate material 14 in regions "A", "B" and "D". Examples of the workfunction materials for an n-channel transistor include TiN, TaN, TaAlC, TiC, TiAl, TaC, Co, Al, TiAl, HfTi, TiSi, TaSi or TiAlC. In one exemplary embodiment, a stack of TiN/TaAlC/TiN is deposited by chemical vapor deposition (CVD), physical vapor deposition (PVD) including sputtering, atomic layer deposition (ALD) or other suitable method.

The deposition of the n-type gate metals 24 will result in four different devices with different, e.g., decreasing, Vt. For example, a first NFET is formed in region "C", a second NFET is formed in region "A", a first PFET is formed in region "B" and a second PFET is formed in region "D", each having a different Vt due to the different thicknesses of the underlying gate material 14. It should be understood by those of skill in the art, though, that the present disclosure contemplates the etching of the gate material 14 in regions "A" through "D" in any order and to any thickness to form devices with different Vt. In addition, there may be more or less patterning steps, e.g., using ALE steps, resulting in more or less different thicknesses of the gate material and, hence more or less devices with different Vt. Accordingly, the present disclosure is not limited to the partial and complete removal of the gate material 14 in the sequence disclosed herein, e.g., regions "A", "B" and "C"; instead, the ALE process can be performed in any sequence within any region to any desired thicknesses of the gate material 14, e.g., T1, T2, T3.

Figure 6:
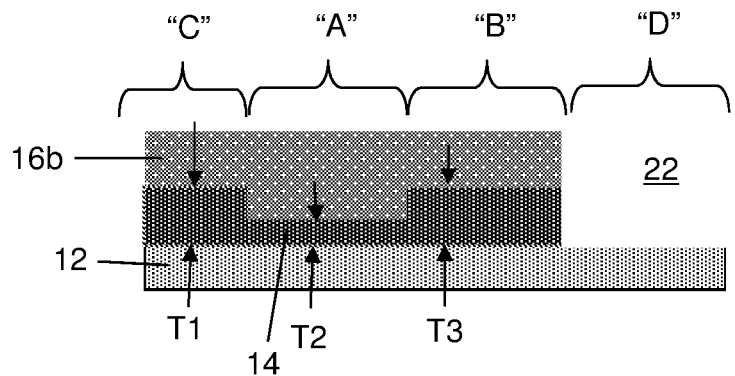
FIG. 6 shows the gate material in a different integration scheme in accordance with aspects of the present disclosure.

FIG. 6 shows an illustrative example of a non-limiting embodiment, where T1, T2, T3 and the complete removal of the high-k dielectric material 12 are provided in a different integration scheme. Accordingly, by implementing the methods described herein, it is now possible to tune the Vt for different devices, without damaging the underlying gate dielectric material 12.

In any of the different scenarios described herein the present disclosure contemplates the need for only a single deposition process for the gate metal 14, resulting in a process flow that does result in air breaks; that is, the deposition process for the gate metal 14 can be performed in a single deposition chamber in a single process, without the need for removal (and hence breaking of the vacuum). In addition, in any of the different scenarios described herein, there is no touching of the gate dielectric material 12 during the etching processes for the devices requiring the gate material 14.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a gate dielectric material;
   a metal gate material directly contacting the gate dielectric material, the metal gate material comprising different thickness in different regions each of which are structured for devices having a different threshold voltage (Vt); and
   a workfunction material on the metal gate material,
   wherein the metal gate material is a p-type workfunction gate material and the workfunction material is a n-type workfunction gate material, and
   wherein the different thickness include at least a non-etched thickness in a first region, a second thickness in a second region, a third thickness in a third region and a region which is devoid of the p-type workfunction gate material.

2. The structure of claim 1, wherein the metal gate material is a workfunction material different than the workfunction material on the metal gate material.

3. The structure of claim 1, wherein the different thicknesses of the metal gate material are provided in different device regions.

4. The structure of claim 1, wherein the metal gate material is in a stepped pattern.

5. The structure of claim 1, wherein the gate dielectric material is a high-k dielectric material.

6. The structure of claim 1, wherein the metal gate material is devoid of air breaks.

7. The structure of claim 6, wherein the metal gate material is a single deposition process of the gate material.

8. The structure of claim 1, wherein, in the region which is devoid of the p-type workfunction gate material, the workfunction material is directly contacting the gate dielectric material and the workfunction material is planar across the first region, the second region, the third region and the region devoid of the p-type workfunction gate material.

9. A structure comprising:
   a gate dielectric material;
   a metal gate material directly contacting the gate dielectric material, the metal gate material comprising different thickness in different regions each of which are structured for devices having a different threshold voltage (Vt); and
   a workfunction material on the metal gate material,
   wherein the metal gate material is a p-type workfunction gate material and the workfunction material is a n-type workfunction gate material, and
   wherein the gate dielectric material is devoid of the p-type workfunction gate material in a region directly adjacent to the metal gate material of a first thickness.

10. A structure comprising:
    a gate dielectric material;
    a metal gate material directly contacting the gate dielectric material, the metal gate material comprising different thickness in different regions each of which are structured for devices having a different threshold voltage (Vt); and
    a workfunction material on the metal gate material,
    wherein the metal gate material is a p-type workfunction gate material and the workfunction material is a n-type workfunction gate material, and
    wherein the different thickness are monolayer differences in thickness.

11. A structure comprising:
    a gate dielectric material;
    a gate material directly contacting the gate dielectric material, the gate material comprising an original thickness in a first region and different thicknesses in different regions from the first region, each of which are structured for devices having a different threshold voltage (Vt); and a workfunction material on the gate material of the original thickness and the different thickness, and contacting the gate dielectric material which is devoid of the gate material.

12. The structure of claim 11, wherein the gate material is a p-type workfunction gate material and the workfunction material is a n-type workfunction gate material.

13. The structure of claim 12, wherein the gate dielectric material is devoid of the p-type workfunction gate material in a region directly adjacent to the gate material of a first thickness.

14. The structure of claim 11, wherein the gate material is in a stepped pattern.

15. The structure of claim 11, wherein the gate material is a single deposition process of the gate material devoid of air breaks.

16. The structure of claim 11, wherein the different thickness are monolayer differences in thickness.

17. The structure of claim 11, wherein a combination of the gate dielectric material, the gate material and the workfunction material are multiple threshold voltage (Vt) devices.

18. The structure of claim 11, wherein, workfunction material on the gate material of the original thickness and the different thickness and on the dielectric material which is devoid of the gate material, is planar.

19. A method comprises:
  in a single deposition process, forming a first metal workfunction material on and directly contacting a gate dielectric material having a first thickness;
  iteratively etching one or more regions of the first metal workfunction material by an atomic layer etching process to remove monolayers of the first metal workfunction material in the one or more different regions, resulting in the first metal workfunction material having different thicknesses than the first thickness; and
  forming a second workfunction material on the first metal workfunction material of different thicknesses,
  wherein the first metal workfunction material is a p-type workfunction gate material and the second workfunction material is a n-type workfunction gate material, and
  wherein the different thickness include at least a non-etched thickness in a first region, a second thickness in a second region, a third thickness in a third region and a region which is devoid of the p-type workfunction gate material.

* * * * *